(12) United States Patent
Mizuno et al.

(10) Patent No.: US 7,047,514 B2
(45) Date of Patent: May 16, 2006

(54) SEMI-CUSTOM-MADE SEMICONDUCTOR INTEGRATED CIRCUIT DEVICE, METHOD FOR CUSTOMIZATION AND METHOD FOR REDESIGN

(75) Inventors: Masaharu Mizuno, Tokyo (JP); Naotaka Maeda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 309 days.

(21) Appl. No.: 10/114,038

(22) Filed: Apr. 3, 2002

(65) Prior Publication Data

US 2002/0145444 A1  Oct. 10, 2002

(30) Foreign Application Priority Data

Apr. 4, 2001 (JP) ............................. 2001-105520

(51) Int. Cl.
*G06F 17/50* (2006.01)
(52) U.S. Cl. .................. 716/14; 716/1; 716/4; 716/9; 716/11
(58) Field of Classification Search ................ 257/204, 257/775; 361/782; 716/2, 4, 19, 1, 11–14, 716/9; 438/17, 130, 455
See application file for complete search history.

(56) References Cited

U.S. PATENT DOCUMENTS

| | | | |
|---|---|---|---|
| 4,910,417 A | 3/1990 | El Gamal et al. | |
| 5,055,718 A | 10/1991 | Galbraith et al. | |
| 5,124,776 A * | 6/1992 | Tanizawa et al. | 257/204 |
| 5,459,093 A | 10/1995 | Kuroda et al. | |
| 5,629,838 A * | 5/1997 | Knight et al. | 361/782 |
| 5,679,967 A | 10/1997 | Janai et al. | |
| 5,684,412 A | 11/1997 | Yoeli et al. | |
| 5,858,817 A | 1/1999 | Bansal | |
| 6,014,038 A | 1/2000 | How et al. | |
| 6,423,558 B1 * | 7/2002 | Maeda et al. | 438/17 |
| 6,613,611 B1 * | 9/2003 | How et al. | 438/130 |
| 6,624,046 B1 * | 9/2003 | Zavracky et al. | 438/455 |
| 2002/0036354 A1 * | 3/2002 | Yamaguchi et al. | 257/775 |

FOREIGN PATENT DOCUMENTS

| | | |
|---|---|---|
| JP | 62-047149 | 2/1987 |
| JP | 64-081337 | 3/1989 |
| JP | 7-106949 | 4/1995 |
| JP | 9-129738 | 5/1997 |
| JP | 2003-315220 | 11/2000 |
| JP | 2001/36052 | 2/2001 |
| WO | WO 99/25023 | 5/1999 |

* cited by examiner

*Primary Examiner*—Thuan Do
(74) *Attorney, Agent, or Firm*—Foley & Lardner LLP

(57) ABSTRACT

An ASIC includes a function layer formed with plural universal logic cells, a common layer formed with conductive strips connected to the universal logic cells and common to other ASICs and a customized layer having at least two metallization layers assigned to conductive strips extending in certain directions parallel to one another and other conductive strips extending in perpendicular directions to the certain directions, respectively, and an inter-layered insulating layer formed with conductive plugs selectively connected between the conductive strips and the other conductive strips, wherein the conductive strips have respective values of length such that the conductive plugs are located on both ends thereof, whereby the conductive strips, other conductive strips and the conductive plugs form plural signal paths reduced in total contact resistance and parasitic capacitance.

10 Claims, 11 Drawing Sheets

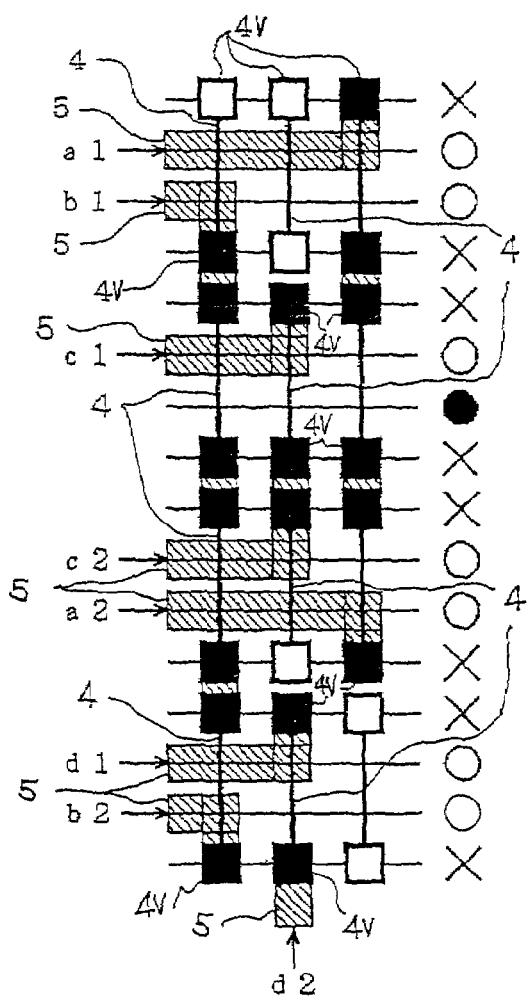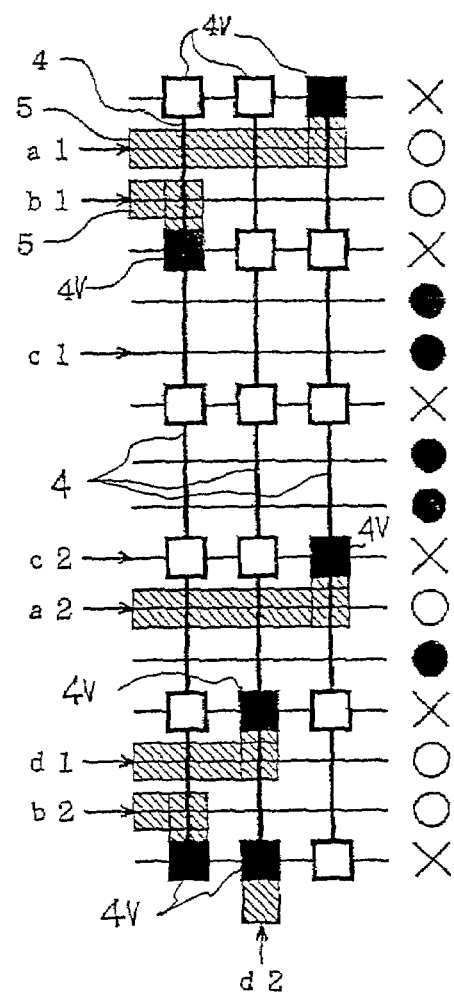
Fig. 1
PRIOR ART
Fig. 2
PRIOR ART

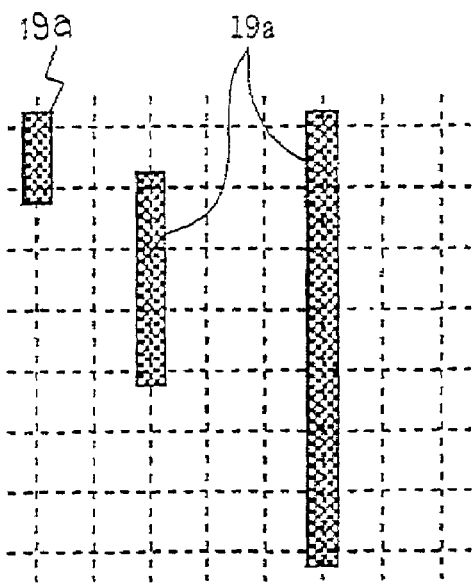
Fig. 1 2 A
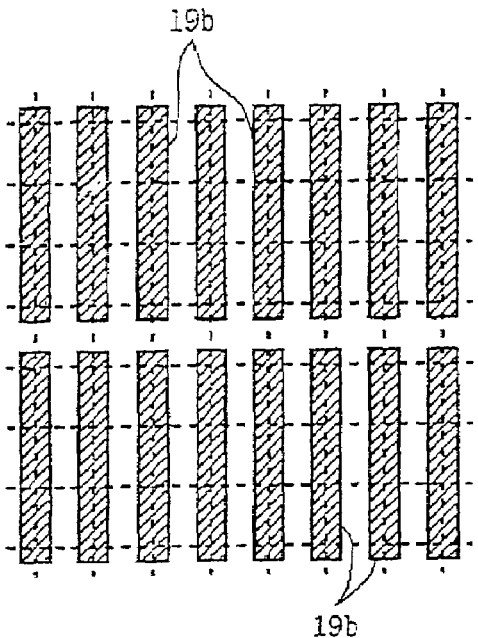
Fig. 1 2 B
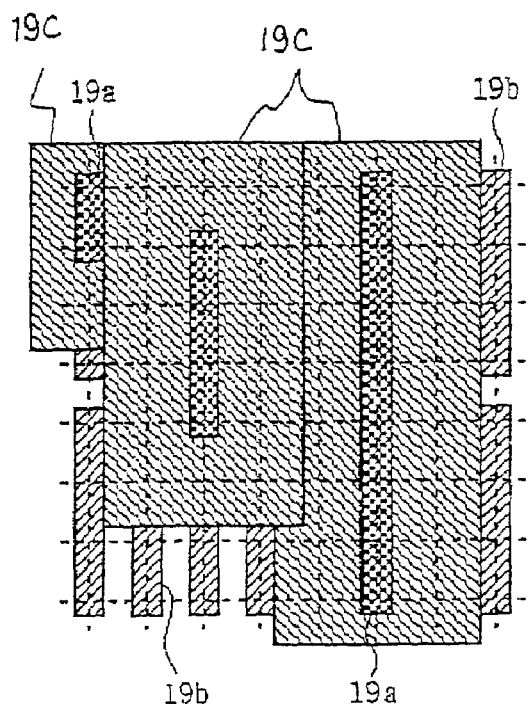
Fig. 1 2 C
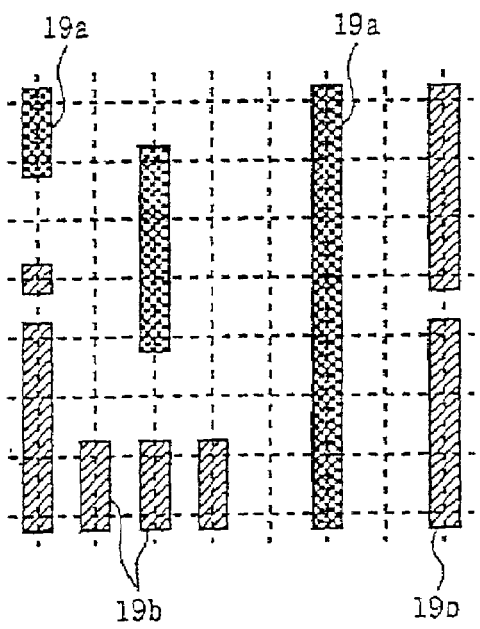
Fig. 1 2 D

US 7,047,514 B2

SEMI-CUSTOM-MADE SEMICONDUCTOR INTEGRATED CIRCUIT DEVICE, METHOD FOR CUSTOMIZATION AND METHOD FOR REDESIGN

FIELD OF THE INVENTION

This invention relates to a semiconductor integrated circuit device and, more particularly, to a semi-custom-made semiconductor integrated circuit device, a method for customization and a method for redesign the semi-custom-made semiconductor integrated circuit device.

DESCRIPTION OF THE RELATED ART

ASIC (Application Specific Integrated Circuit) is defined as "integrated circuits customized for specific users. The ASICs are broken down into two categories. The first category is referred to as "cell-based integrated circuit", and the other category is referred to as "gate array". The cell-based integrated circuit requires a set of customized photo-masks for a complete process, i.e., from the fabrication of circuit components to the metallization. On the other hand, the gate arrays are fabricated on master slices common to different users. Circuit components such as logic gates are fabricated on the master slice, and are programmable through the metallization. In other words, the master slices are individualized through the metallization. Thus, the gate array requires customized photo-masks only for the metallization. The term "semi-custom-made integrated circuit" is applied to various sorts of integrated circuit devices partially common to different users and partially customized to specific users.

Various design/fabrication technologies have been proposed for the ASICs. The design/fabrication technologies for LSI (Large-Scale-Integration) are disclosed in U.S. Pat. No. 5,858,817 and PCT publication No. WO 99/25023. The design/fabrication technologies permit a designer to select a logic function from plural candidates, and the ASIC is fabricated on the basis of the mask-programmable function blocks. In detail, universal function blocks have been arrayed on a semiconductor wafer, and the circuit components of each function block have been connected through a lower metallization layer. An array of segmentalized conductive patterns has been further formed on an upper metallization layer. Thus, the multi-layered structure includes the circuit components of the function blocks, the wiring for the circuit components and the segmentalized conductive patterns, and is common to different users. Thus, the prior art design/fabrication technologies are based on a master wafer like the master slice for the gate array. When the function to be required is determined, the manufacturer designs the upper metallization layer, and the function blocks are selectively connected through the upper metallization layer. In order to connect the function blocks, the manufacturer designs wiring paths on the basis of the segmentalized conductive patterns, and the function blocks are connected to selected ones of segmentalized conductive patterns. Only one photo-mask is required. Thus, the master wafers are customized through only one mask-step.

PCT publication No. WO 99/25023 teaches that via-holes beneath the upper metallization layer are used in the customization of the master wafers.

Japanese Patent Application laid-open No. 7-106949, which is corresponding to the U.S. Patent Application resulted in U.S. Pat. No. 5,055,718, teaches the circuit configuration of a universal logic module. The universal logic module includes multiplexers, and users can determine their combined logic functions by using the multiplexers. The Japanese Patent Application laid-open teaches that the universal logic module includes a 4-input multiplexer and that three 2-input multiplexers form in combination the 4-input multiplexer. Four input signals are supplied to a pair of 2-input multiplexers, and two output signals are supplied from the pair of 2-input multiplexers to the third 2-input multiplexer. The Japanese Patent Application laid-open is silent to the circuit configuration of the 2-input multiplexers. A standard 2-input multiplexer is constituted by three stages, i.e., the first inverter stage, the second transfer gate stage and the third inverter stage. If the 4-input multiplexer is implemented by the standard 2-input multiplexers, the input signals are to pass six stages, i.e., 3 stages×2 until the output node of the 4-input multiplexer. If the 4-input multiplexer is implemented by 2-input multiplexers of the type having an inverted output, the third inverter stage is not required. In this instance, the input signal is to pass 4 stages until the output node of the 4-input multiplexer.

The 4-input multiplexer may be implemented by the combination of inverters and transfer gates. In this instance, the input signal is to pass 4 stages until the output node of the 4-input multiplexer.

Another universal logic module is disclosed in U.S. Pat. No. 5,684,412 entitled as "CELL FORMING PART OF A CUSTOMIZABLE LOGIC ARRAY". The prior art universal logic module includes a NAND gate, two 2-input multiplexers A/A and a 2-input multiplexer LARGE. The 2-input multiplexer A has the first inverter stage and the second transfer gate stage, and the 2-input multiplexer LARGE includes the first transfer gate stage and the second inverter stage. Thus, when an input signal is supplied to the universal logic module, the input signal is to pass logic stages at the maximum.

Other kinds of the universal logic module are disclosed in U.S. Pat. Nos. 4,910,417 and 6,014,038. Plural combined logic functions are selective in these kinds of the universal logic modules.

As described hereinbefore, the prior art universal logic modules are capable of achieving plural logic functions. The prior art universal logic module is implemented by a series combination of 2-input multiplexers, and is equivalent to a multi-input multi-stage multiplexer. Logic "1", which may be represented by the power voltage, and logic "0", which may be represented by the ground voltage, are selectively supplied to the multi-input multi-stage multiplexer, the multi-input multi-stage multiplexer achieves a predetermined logic function.

Description is hereinbelow made on the metal option in the prior art semi-custom-made integrated circuit device. FIG. 1 shows the signal propagation paths a1–a2, b1–b2, c1–c2 and d1–d2 in a prior art semi-custom-made integrated circuit device. Although the prior art semi-custom-made integrated circuit device has a five-layered metallization structure, the fourth metallization layer and the fifth metallization layer are illustrated in FIG. 1. The fourth metallization layer includes three columns of conductive segments 4. Four conductive segments 4 form each column, and, accordingly, twelve conductive segments 4 are shown in FIG. 1. Twelve pairs of via-holes 4V are formed in the inter-layered insulating layer between the fourth metallization layer and the fifth metallization layer, and are respectively associated with the twelve conductive segments 4. The twenty-four via-holes 4V are arranged in eight rows. Both end portions of each conductive segment 4 are exposed to the via-holes of the associated pair. The conductive segments 4 and via-holes 4V were formed in the master wafer for the prior art semi-custom-made integrated circuit device.

The fifth metallization layer includes conductive strips 5 indicated by hatching lines. A conductive layer is deposited on the inter-layered insulating layer, and is patterned into the conductive strips 5 through a photo-lithography and etching. Although sixteen lateral lines are drawn in FIG. 1, these lateral lines are indicative of the tracks available for the conductive strips 5. Two rows of via-holes 4V are provided on both sides of every two tracks.

The signal path a1–a2 includes the conductive strips 5 formed in the second and eleventh tracks, and the conductive strip 5 in the second track is connected through the rightmost column of conductive segments 4. The conductive segments 4 in the rightmost column are connected through the six via-holes 4V to one another, which black squares stand for. The signal path b1–b2 includes the conductive strips in the third and fifteenth tracks, and the conductive strip 5 in the third track is connected through the leftmost column of conductive segments 4. The conductive segments 4 in the leftmost column are connected through the seven via-holes 4V to one another, which black squares stand for. On the other hand, the signal path c1–c2 includes the sixth and tenth tracks, and the conductive strip 5 in the sixth track is connected through the center column of conductive segments 4. The conductive segments 4 in the center column are connected through the three via-holes 4V to one another. Although the three columns of conductive segments 4 are respectively assigned to the three signal paths a1–a2, b1–b2 and c1–c3, the three signal paths a1–a2, b1–b2 and c1–c2 do not require all the conductive segments 4. For this reason, the fourth signal path d1–d2 is established in the fourth and fifth metallization layers. In detail, the conductive strip 5 in the fourteenth track is connected through the unused conductive segment 4 in the center column to the conductive strip 5. Two via-holes 4V are required for the vertical connection between the conductive strips 5 of the fifth metallization layer and the conductive segment 4 of the fourth metallization layer.

FIG. 2 shows another metal option in the prior art semi-custom-made integrated circuit device. In the fourth metallization layer, the conductive segments 4 are replaced with three conductive layers 4. In other words, the conductive layers 4 in the fourth metallization layer are not divided into segments, and the via-holes 4V are formed over intermediate portions of each conductive layer 4 as well as both end portions thereof. For this reason, only three signal paths a1–a2, b1–b2 and d1–d2 are established in the fourth and fifth metallization layer.

In detail, the rightmost conductive layer 4, leftmost conductive layer 4 and the center conductive layer 4 are respectively assigned to the signal paths a1–a2, b1–b2 and d1–d2. The signal path a1–a2 includes the conductive strips 5 in the second and eleventh tracks connected through the rightmost conductive layer 4, and the conductive strips 5 are connected to the rightmost conductive layer 4 through only two via-holes 4V, which black squares stand for. The signal path b1–b2 includes the conductive strips 5 in the third and fifteenth tracks, and the conductive strips 5 are connected to the leftmost conductive layer 4 through only two via-holes 4V, and the signal path d1–d2 includes the conductive strips 5 in the fourteenth and sixteenth tracks, and the conductive strips 5 are connected to the center conductive layer 4 through two via-holes 4V, which black squares stand for.

Problems inherent in the prior arts are discussed in detail. The prior art shown in FIG. 1 and the other prior art are hereinbelow referred to as "first prior art" and "second prior art", respectively. In the first and second prior arts, unused tracks are labeled with black circles. The tracks labeled with white circles are occupied by the conductive strips 5 of the fifth metallization layer. The rows of via-holes 4V are labeled with mark "X". The via-holes 4V used for the vertical connections are in black, and unused via-holes are in white.

In the first prior art, the three columns of conductive segments 4 are consumed by the four signal paths a1–a2, b1–b2, c1–c2 and d1–d2. Only one track is unused. However, eight rows of via-holes 4V are required for the vertical connections. The eight rows of via-holes 4V are too many to offer the eight tracks to the signal paths, because only a half of the length is available for the tracks. In other words, the via-holes 4V consume a large amount of area on the fifth metallization layer, and only a half of the area is available for the conductive strips 5. Thus, the first problem inherent in the first prior art metal option is uneconomical usage of the resources.

On the other hand, the three conductive layers 4 are consumed by the three signal paths a1–a2, b1–b2 and d1–d2 in the second prior art. One more conductive layer 4 is required for the four signal paths a1–a2, b1–b2, c1–c2 and d1–d2. The ten tracks are associated with the six rows of via-holes 4V. The area consumed by the via-holes 4V is narrower than the area consumed by the via-holes 4V in the first prior art. The ratio of the area assigned to the tracks to the area assigned to the via-holes 4V is larger than the ratio in the first prior art. However, the via-holes 4V still consumes a wide area. Thus, the first problem inherent in the second prior art metal option is also the uneconomical usage of the resources.

The signal paths are to propagate signals between electric circuits fabricated in the master wafer. The first and second prior arts metal options are not desirable from the viewpoint of the signal propagation characteristics. Although the signal path d1–d2 requires two via-holes 4V in both first and second prior arts, the first prior art requires more than two via-holes 4V for each of the other signal paths a1–a2, b1–b2 and c1–c2, but each of the signal paths a1–a2 and b1–b2 passes only two via-holes 4V in the second prior art. This is because of the fact that the conductive layer is divided into the segments 4 in the first prior art. The more the via-holes 4V, the larger the total contact resistance. The signals are undesirably delayed due to the large time constant along the signal paths a1–a2, b1–b2 and c1–c2. Thus, the second problem inherent in the first prior art metal option is the poor signal propagation characteristics.

Although the conductive strips 5 of the signal path a1–a2 and the conductive strips 5 of the signal path b1–b2 are spaced by the length equivalent to nine pitches and the length equivalent to eleven pitches, the conductive layers 4 are equal to fifteen pitches. Namely, the conductive layers 4 have the portions unused for the signal propagation. The unused portion is causative of a large amount of parasitic capacitance. The signals are delayed due to the large time constant along the signal paths a1–a2 and b1–b2. Thus, the second problem inherent in the second prior art metal option is also poor signal propagation characteristics.

The signal propagation paths a1–a2, b1–b2, c1–c2 and d1–d2 are different in length from one another in both first and second prior art metal options. If the signal propagation paths are assigned to clock signals to certain clocked circuits, the skew is serious due to the large difference between the signal paths. Thus, the third problem inherent in the first and second prior art metal options is the unequal signal propagation paths.

SUMMARY OF THE INVENTION

It is therefore an important object of the present invention to provide a semi-custom-made integrated circuit device, which offers a high degree of freedom and signal paths reduced in contact resistance and parasitic capacitance to designers who customize it.

It is also an important object of the present invention to provide a customizing method for the semi-custom-made integrated circuit device.

It is also an important object of the present invention to provide a method for redesigning the semi-custom-made integrated circuit device.

In accordance with one aspect of the present invention, there is provided a semi-custom-made integrated circuit device comprising a function layer formed with function blocks on a substrate, and a multi-layered metallization structure formed over the function layer and including at least one common layer having at least one conductive pattern connected to the function blocks and common to plural sorts of semi-custom-made integrated circuit devices and a customized layer formed on the at least one common layer and including a lower metallization layer having a first pattern of conductive stripes selectively connected to the function blocks and directed in certain directions parallel to one another, an upper metallization layer having a second pattern of conductive strips directed in directions perpendicular to the certain directions and an inter-layered insulating layer inserted between the lower metallization layer and the upper metallization layer and having a third pattern of conductive plugs selectively connected between the conductive strips of the first pattern and the conductive strips of the second pattern. In accordance with another aspect of the present invention, there is provided a method for customizing an intermediate structure of a semi-custom-made integrated circuit device having at least two metallization layers assigned to lower conductive strips extending in certain directions parallel to one another and upper conductive strips extending in directions perpendicular to the certain directions and an inter-layered insulating layer inserted between the lower conductive strips and the upper conductive strips, and the method comprises the steps of a) preparing a first design data representative of a first pattern of the lower conductive strips, a first dummy data representative of a first dummy pattern of possible conductive strips equal in length and two-dimensionally arranged at regular pitches, a second design data representative of a second pattern of the upper conductive layers, a third design data representative of a third pattern of contact holes to be formed in the inter-layered insulating layer and the lower conductive strips and a second dummy data representative of a second dummy pattern of possible contact holes to be formed in the inter-layered insulating layer and the possible conductive strips, b) magnifying the first design data so as to produce a magnified data representative of a resized pattern of extensions occupying closed areas around the lower conductive strips, c) deleting the possible conductive strips perfectly and partially overlapped with the lower conductive strips and the extensions from the first dummy pattern so as to determine a first resultant pattern for one of the at least two metallization layers, d) determining a second resultant pattern of the contact holes on the basis of the third design data and the second dummy data and e) determining a third resultant pattern for the other of the at least two metallization layers.

In accordance with yet another aspect of the present invention, there is provided a method for redesigning a semi-custom-made integrated circuit device including a function layer formed with plural function blocks, a common layer formed on the function layer and having at least conductive pattern connected to the function blocks and common to plural sorts of semi-custom-made integrated circuit devices and a customized layer having a first pattern of conductive strips, a second pattern of conductive strips and an inter-layered insulating layer inserted between the first pattern and the second pattern and formed with a third pattern of conductive plugs selectively connected between the first conductive strips and the second conductive strips, and the method comprises the steps of a) reviewing the first pattern see what conductive strips are to be connected to the conductive strips of the second pattern without changing the first pattern, b) checking photo-masks for the second and third patterns to see how many photo-masks are to be newly designed and c) designing at least one of the photo-mask for a new semi-custom-made integrated circuit device.

BRIEF DESCRIPTION OF THE DRAWINGS

The features and advantages of semi-custom-made integrated circuit device and the method will be more clearly understood from the following description taken in conjunction with the accompanying drawings, in which FIG. 1 is a schematic plane view showing the signal propagation paths in the prior art semi-custom-made integrated circuit device, FIG. 2 is a schematic plane view showing the signal propagation paths in another prior art semi-custom-made integrated circuit device, FIGS. 12A to 12D are schematic plane views showing another design work on the fourth metallization layer.

DESCRIPTION OF THE PREFERRED EMBODIMENTS

Structure of Semi-Custom-Made Integrated Circuit Device

Figure 3:
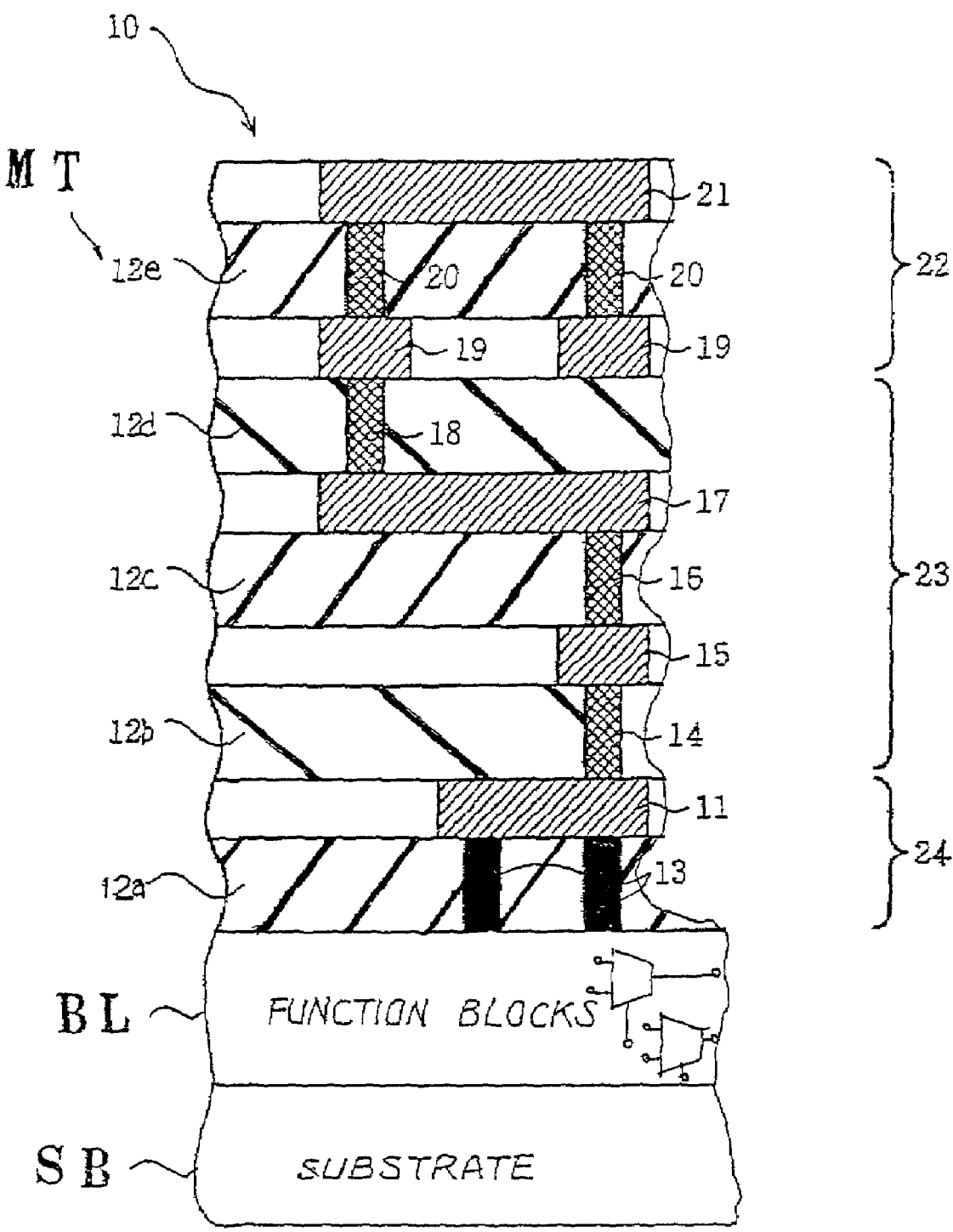
FIG. 3 is a schematic cross sectional view showing the structure of an ASIC according to the present invention.

Referring to FIG. 3 of the drawings, an ASIC embodying the present invention is designated by reference numeral 10. The ASIC 10 is fabricated on a semiconductor substrate SB. The ASIC 10 is broken down into a function block layer BL and a multi-layered structure of metallization MT. The function block layer BL includes plural function blocks, and universal logic cells form in combination each of the function blocks. Although a large number of universal logic cells are incorporated in the function blocks, only two universal logic cells are shown in FIG. 3. Each function block may have one of the circuit configurations described in connection with the background of the invention.

The multi-layered structure of metallization MT includes five metallization layers 11, 15, 17, 19 and 21 and inter-layered insulating layers 12a, 12b, 12c, 12d and 12e. In detail, the function block layer BL is covered with the first inter-layered insulating layer 12a, and the first metallization layer 11 is patterned on the first inter-layered insulating layer 12a. Via-holes are formed in the first inter-layered insulating layer 12a, and are filled with conductive plugs 13. The function blocks are selectively connected through conductive plugs 13 to the first metallization layer 11. The first metallization layer 11 is covered with the second inter-layered insulating layer 12b, and the second metallization layer 15 is patterned on the second inter-layered insulating layer 12b. Via-holes are formed in the second inter-layered insulating layer 12b, and are filled with conductive plugs 14. The first metallization layer 11 is electrically connected through the conductive plugs 14 to the second metallization layer 15.

Similarly, the second metallization layer 15 is covered with the third inter-layered insulating layer 12c, and the third metallization layer 17 is patterned on the third inter-layered insulating layer 12c. Via-holes are formed in the third inter-layered insulating layer 12c, and are filled with conductive plugs 16. The second metallization layer 15 is electrically connected through the conductive plugs 16 to the third metallization layer 17. The third metallization layer 17 is covered with the fourth inter-layered insulating layer 12d, and the fourth metallization layer 19 is patterned on the fourth inter-layered insulating layer 12d. Via-holes are formed in the fourth inter-layered insulating layer 12d, and are filled with conductive plugs 18. The third metallization layer 17 is electrically connected through the conductive plugs 18 to the fourth metallization layer 19. The fourth metallization layer 19 is covered with the fifth inter-layered insulating layer 12e, and the fifth metallization layer 21 is patterned on the fifth inter-layered insulating layer 12e. Via-holes are formed in the fifth inter-layered insulating layer 12e, and are filled with conductive plugs 20. The fourth metallization layer 19 is electrically connected through the conductive plugs 20 to the fifth metallization layer 21.

The five metallization layers 11, 15, 17, 19 and 21 and the via-holes 13, 14, 16, 18 and 20 are classified into three groups 22, 23 and 24. The highest group 22, intermediate group 23 and the lowest group 24 are referred to as "Group A", "Group B" and "Group C", respectively. Patterns in Group "A" are arbitrarily designed for ASICs ordered by different users. In other words, the ASIC 10 is customized with the metallization layers 19/21 and the array of conductive plugs 20. On the other hand, the metallization layers 11/51/17 and the arrays of conductive plugs 13/14/16/18 are fixed to certain patterned, and the patterns in Groups "B" and "C" are common to ASICs ordered by different users. When an integrated circuit device, which was customized on the basis of the ASIC, is redesigned, the manufacturer changes the array of the fifth conductive plugs 20 and the fifth metallization layer 21, and reuses the fourth metallization layer 19. Otherwise, the manufacturer reuses the fourth metallization layer 19 and the array of conductive plugs 20, and only the fifth metallization layer 21 is redesigned.

Group "A" 22 includes the fourth metallization layer 19, conductive plugs 20 and the fifth metallization layer 21. The pattern in the fourth metallization layer 19, the pattern of the conductive plugs 20 and the pattern in the fifth metallization layer 21 are changeable. In other words, the fourth metallization layer 19, the array of conductive plugs 20 and the fifth metallization layer 21 have respective patterns unique to the ASIC 10, and are usually different from the patterns incorporated in other ASICs. Thus, the ASIC 10 is customized with the patterns of Group "A".

Group "B" 23 includes the conductive plugs 14, second metallization layer 15, conductive plugs 16, third metallization layer 17 and the conductive plugs 18. Conductive strips in the second and third metallization layers 15/17 and the conductive plugs 14/16/18 serve as power distribution lines, ground lines, signal lines for a test circuit and clock signal lines and have respective patterns common to ASICs. The test circuit includes a built-in self-test circuitry for a memory, and is assigned a part of the function block layer BL. The signal lines for the test circuit are, by way of example, signal lines for the built-in self-test circuitry, a chain wiring for scanning, another chain wiring for a boundary scanning in input and output circuits and a bus system used in tests in various sorts of modules.

Group "C" includes the conductive plugs 13 and the first metallization layer 11, and the conductive plugs 13 and the first metallization layer 11 occupy the area over the region assigned to the function blocks. The conductive strips in the first metallization layer 11 and the conductive plugs 13 serve as the interconnections for the universal logic cells together with conductive strips incorporated in the function block layer BL, and have the respective patterns common to ASICs.

Figure 4:
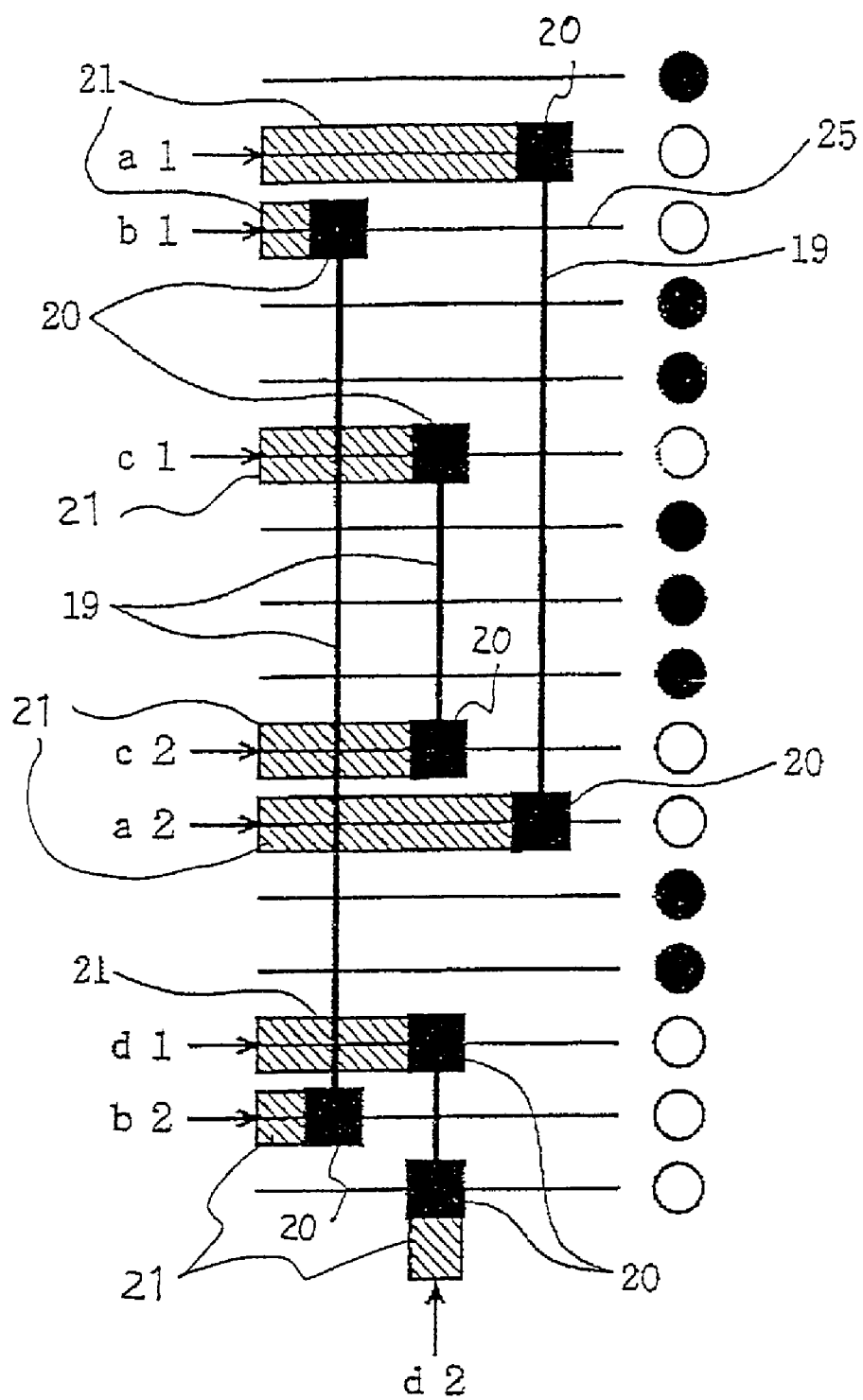
FIG. 4 is a schematic plane view showing the layout of conductive strips and contact holes customized in the ASIC according to the present invention.
Figure 8:
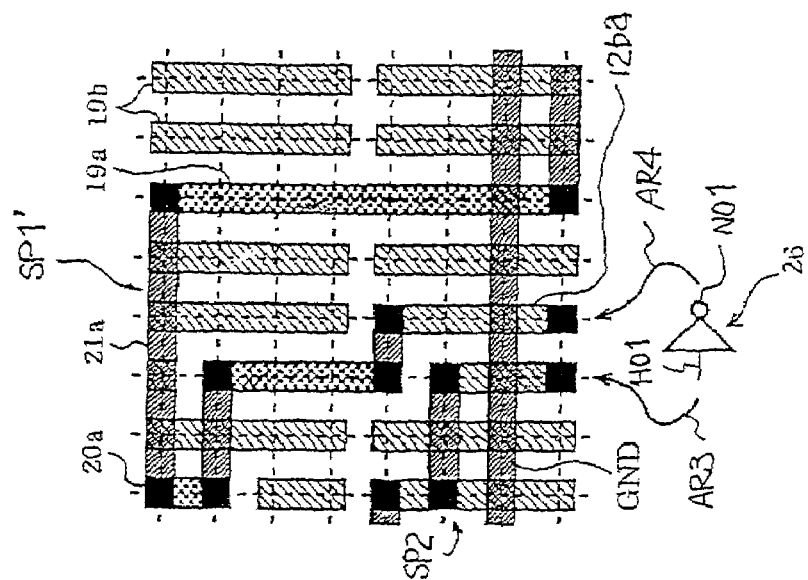
FIG. 8 is a schematic plane view showing the arrangement of conductive strips in the customized layer designed for another ASIC through a redesign work.

The signal paths a1–a2, b1–b2, c1–c2 and d1–d2 are established in Group "A" as shown in FIG. 4. The lateral lines are representative of tracks on the fifth inter-layered insulating layer 12e, and the tracks are selectively used for conductive strips 21 in the fifth metallization layer 21. Conductive strips 19 in the fourth metallization layer 19 are laid on a pattern preferable for the conductive strips 21. The contact holes are formed in the fifth inter-layered insulating layer 12e, and are positioned over both ends of the conductive strips 19. For this reason, there is not any unused contact hole in the fifth inter-layered insulating layer 12e.

The signal path a1–a2 has the conductive strips 21 in the second and eleventh tracks. The conductive strip 19 extends between the second track and the eleventh track, and the conductive plugs 20 connect the conductive strips 21 in the second and eleventh tracks to both ends of the conductive strip 19. Only two vertical connections are required for the signal path a1–a2, and the conductive strip 19 does not have any additional portion, which does not participate the signal propagation.

The signal path b1–b2 has the conductive strips 21 in the third and fifteenth tracks. The conductive strip 19 extends between the third track and the fifteenth track, and the conductive plugs 20 connect the conductive strips 21 in the third and fifteenth tracks to both ends of the conductive strip 19. Only two vertical connections are required for the signal path b1–b2 as similar to the signal path a1–a2, and the conductive strip 19 does not have any additional portion, which does not participate the signal propagation.

The signal path c1–c2 has the conductive strips 21 in the sixth and tenth tracks. The conductive strip 19 extends between the sixth track and the tenth track, and the conductive plugs 20 connect the conductive strips 21 in the sixth and tenth tracks to both ends of the conductive strip 19. Only two vertical connections are required for the signal path c1–c2, and the conductive strip 19 does not have any additional portion, which does not participate the signal propagation.

The signal path d1–d2 has the conductive strips 21 in the fourteen and sixteenth tracks. The conductive strip 19 extends between the fourteenth track and the sixteenth track, and the conductive plugs 20 connect the conductive strips 21 in the fourteenth and sixteenth tracks to both ends of the conductive strip 19. Only two vertical connections are required for the signal path d1–d2, and the conductive strip 19 does not have any additional portion, which does not participate the signal propagation.

As will be understood from the foregoing description, more than one metallization layer 19/21 and an array of conductive plugs 20 are incorporated in Group "A" of the multi-layered structure of the metallization MT, and each of the signal paths a1–a2, b1–b2, c1–c2 and d1–d2 requires only one pair of conductive plugs 20 and the conductive strip 19 with the length equal to the gap between the conductive strips 21. For this reason, the total contact resistance along each signal path a1–a2, b1–b2 or c1–c2 is smaller than the total contact resistance along the corresponding signal path in the first prior art, and the parasitic capacitance coupled to each signal path a1–a2, b1–b2 or d1–d2 is smaller than the parasitic capacitance coupled to the corresponding signal path in the second prior art.

The tracks labeled with black circles are unused. The tracks used for the signal paths a1–a2, b1–b2, c1–c2 and d1–d2 are arbitrarily replaceable with the unused tracks. Thus, Group "A" of the multi-layered structure of metallization MT according to the present invention enhances the flexibility in the design work.

Design Method

The ASIC 10 has the multi-layered structure of metallization MT on the function block layer BL, and the multi-layered structure of metallization is divided into the customized layer, i.e., Group "A" and the ready-made layer, i.e., Groups "B" and "C". Most of the signal lines for the universal logic cells, power distribution lines, ground lines, clock signal lines and the signal lines for the test circuit are usually common to ASICs, and are assigned the ready-made layer. On the other hand, the remaining signal lines are unique to the ASIC 10, and are assigned the customized layer. In this instance, the customized layer includes three patterns, and, accordingly, the manufacturer needs to tailor three photo-masks for the three patterns.

In the design work on the photo-masks, two lower photo-masks, i.e., the photo-mask for the fourth metallization layer 19 and the photo-mask for the array of contact holes to be filled with the conductive plugs 20 are designed as follows. A predetermined data processing is carried out on design data representative of conditions to be satisfied by the photo-masks and a dummy data representative of arrays of possible conductive strips available for signal paths over the entire surface over the substrate SB. The two photo-masks are determined for the first customized ASIC. Improvement in circuit characteristics and reduction in power consumption are the goals to be achieved through the patterns. The other photo-mask for the fifth metallization layer 21 is designed for the first ASIC on the basis of the pattern for the fourth metallization layer 19 and the pattern for the array of conductive plugs 20.

When the first customized ASIC is redesigned for another ASIC, it is preferable to use the result of the previous design work, because the redesign work is completed within a short time. In order words, the photo-masks designed for the first ASIC are to be reused for another ASIC as many as possible. However, the manufacturer unavoidably needs to tailor the photo-mask for the fifth metallization layer 21 in the redesign work. From this point of view, it is preferable to determine the potentials at the terminals of the universal logic cells and connections to the terminals through the design work on the photo-mask for the uppermost metallization layer.

In the data processing, it is preferably to reduce the parasitic capacitance coupled to the conductive strips adjacent to each other as much as possible, because the parasitic capacitance is causative of the signal delay along the conductive strips. From this point of view, the design data for the masks is modified as if the conductive strips are increased in width by 2 pitches, by way of example, and the subtraction, i.e., NOT operation is carried out on the modified design data for the masks and the dummy data. Finally, the difference obtained through the subtraction is added to or ORed with the original design data for the mask.

Thus, although the fourth and fifth metallization layers 19/21 and the array of the conductive plugs 20 are arbitrarily designed in each customizing work, the manufacturer takes the redesign work for other ASICs into account, and designs the first set of photo-masks so as to reduce the photo-mask to be redesigned.

FIGS. 5, 6, 7, 8 and 9 illustrate customizing works on different ASICs. The manufacturer is assumed to customize the ASIC according to the present invention through the first design work on the photo-masks for the fourth and fifth metallization layers 19/21 and the photo-mask for the array of contact holes to be filled with the conductive plugs 20. The function block layer BL of an integrated circuit device includes unused inverter 26. The ground line GND is to be connected to the input node H01 of the unused inverter 26 as indicated by arrow AR1 in FIG. 5, and the contact hole for the conductive plug 20a is assigned to the output node NO1 of the unused inverter 26 as indicated by arrow AR2. Another signal path SP1 is required for the integrated circuit.

Figure 6:
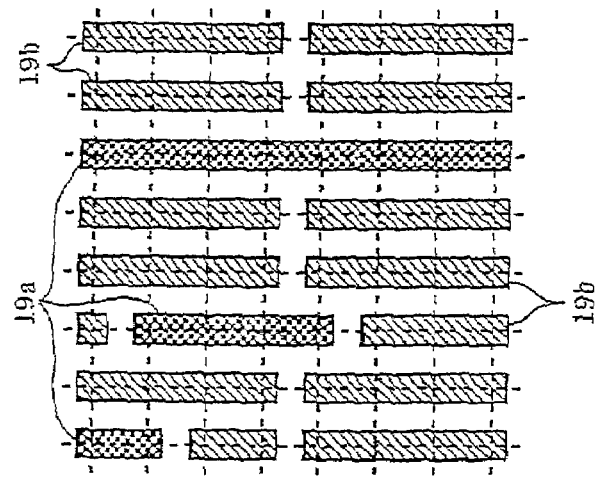
FIG. 6 is a schematic plane view showing conductive strips and dummy conductive strips in a fourth metallization layer selected from a dummy data for the ASIC.
Figure 5:
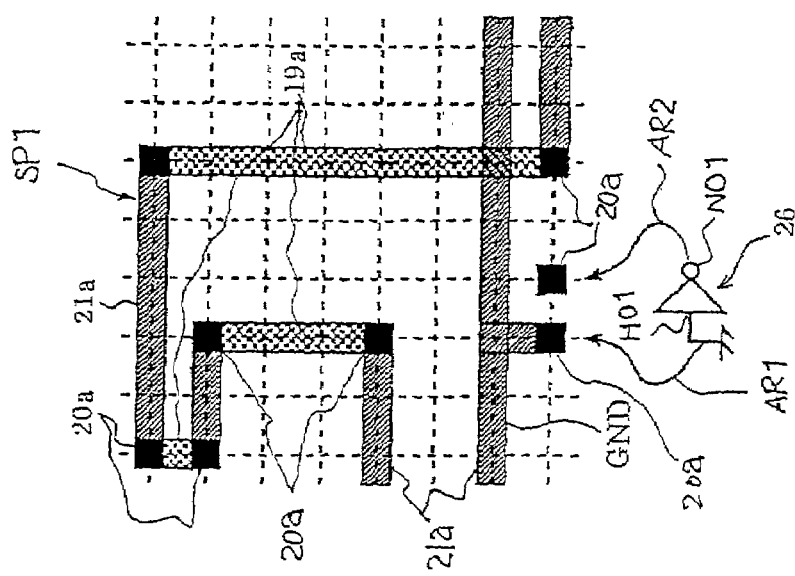
FIG. 5 is a schematic plane view showing the arrangement of conductive strips in a customized layer designed for an ASIC.

A user gives an order for the integrated circuit device to the manufacture. The manufacturer designs the integrated circuit device on the basis of the ASIC according to the present invention. The manufacturer overlaps the design data representative of the arrangement shown in FIG. 5 with the dummy data representative of the array of possible conductive strip on the screen of a computer-aided design tool, and determines the conductive strips 19a and dummy conductive strips 19b as shown in FIG. 6. The dummy conductive strips 19b neither propagate any signal nor power voltage. However, the dummy conductive strips 19b make the etching uniformly proceed. The pattern of the conductive strips 19a/19b is to be transferred to the fourth metallization layer 19, and the photo-mask for the fourth metallization layer 19 is designed to have the pattern.

Figure 7:
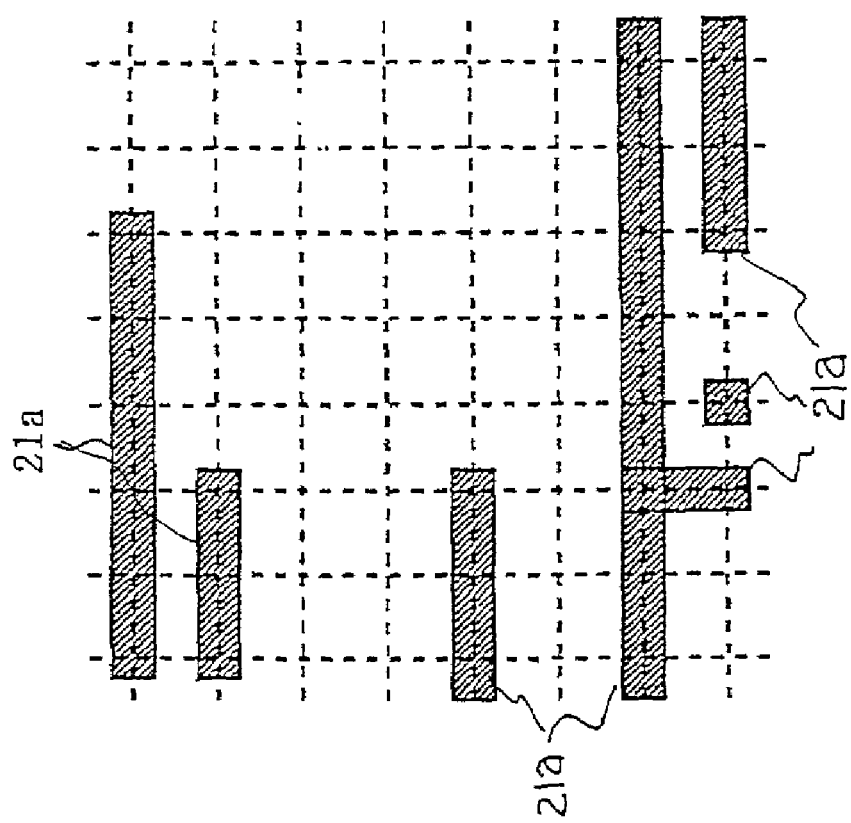
FIG. 7 is a schematic plane view showing conductive strips in a fifth metallization layer for the ASIC.

The contact holes are to be formed at the positions over both ends of the conductive strips 19a, and the photo-mask for the contact holes are designed to have the pattern. The manufacturer further requires a photo-mask for the fifth metallization layer 21. The manufacturer designs the photo-mask representative of the pattern of conductive strips 21 a as shown in FIG. 7. Thus, the manufacturer customizes the ASIC for the user with the three photo-masks.

The user is assumed to request the manufacturer to change the connection of the input node H01 from the ground line GND to an output node of another logic gate. The manufacturer is to redesign the integrated circuit device and, accordingly, the photo-masks. In the new integrated circuit device, the inverter 26 participates the signal processing, and a signal path SP2 and the signal path SP1' are to be connected to the input node H1 and the output node NO1 as indicated by arrows AR3 and AR4 in FIG. 8.

Figure 9:
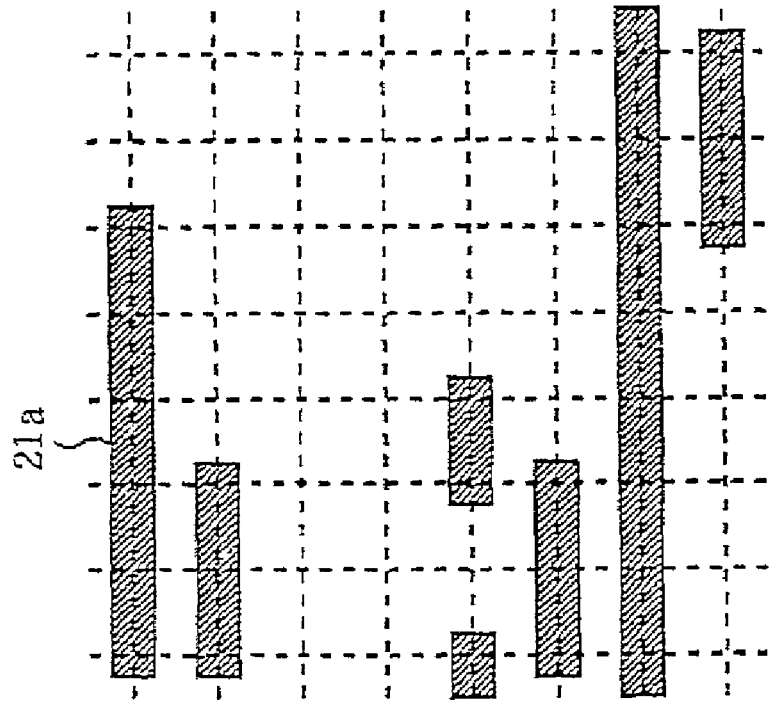
FIG. 9 is a schematic plane view showing the arrangement of conductive strips in the fifth metallization layer for the ASIC through the redesign work.

Although one of the dummy conductive strip 12ba is required for the connection between the output node NO1 and the signal path SP1, the pattern of the conductive strips/dummy conductive strips 19a/19b is unchanged. The photo-mask for the fourth metallization layer 19 is available for the new integrated circuit device. However, additional contact holes for the conductive plugs 20 and additional conductive strips 21a are required for the new integrated circuit device. The manufacturer redesigns the photo-mask for the contact holes to be filled with the conductive plugs 20 and the photo-mask for the fifth metallization layer 21. The pattern of the conductive strips 21a is shown in FIG. 9. Thus, the manufacturer customizes the ASIC according to the present invention with a new set of photo-masks.

Description is hereinbelow made on the design work on the photo-masks in detail. FIGS. 10A to 10D illustrate the design work on the photo-mask for the fourth metallization layer 19. The conductive strips 19A are to be formed in the fourth metallization layer 19, and the design data is representative of the pattern of conductive strips 19A shown in FIG. 10A. When a designer calls the design data representative of the conductive strips 19a in the fourth metallization layer 19, the computer-aided design tool produces the image shown in FIG. 10A on the screen. On the other hand, when the designer calls the dummy data representative of the array of possible conductive strips 19b in the fourth metallization layer, the computer-aided design tool produces the image shown in FIG. 10B.

Figure 10A:
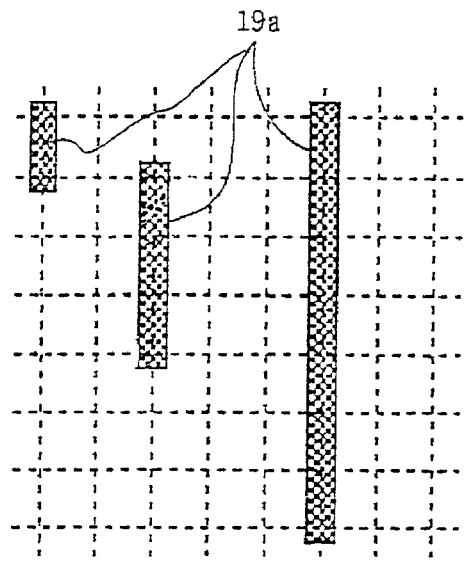
FIGS. 10A to 10D are schematic plane views showing a design work on the fourth metallization layer.
Figure 10B:
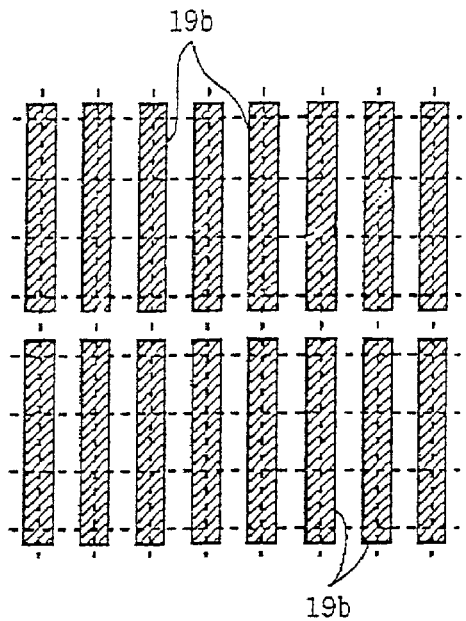
Figure 10C:
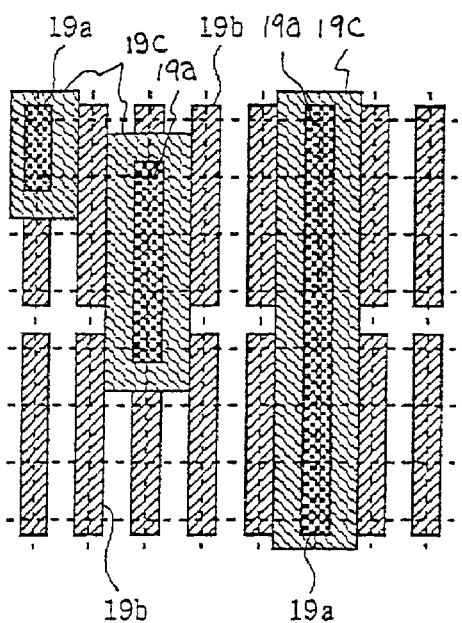

The designer instructs the computer-aided design tool to overlap the design data representative of the conductive strips 19a with the dummy data representative of the possible conductive strips 19b and to resize the conductive strips 19a. The computer-aided design tool produces composite data representative of conductive strips 19a overlapped with the possible conductive strips 19b, and overlaps the image shown in FIG. 10A with the image shown in figure 10B. The computer-aided design tool magnifies the conductive strips 19a. In this instance, the computer-aided design tool expands each conductive strip 19a by the length equivalent to two pitches in both of the lateral and longitudinal directions. The computer-aided design tool produces an image of the magnified conductive strips 19c, and overlaps the image of the magnified conductive strips 19c with the images of the conductive strips/possible conductive strips 19a/19b as shown in FIG. 10C. The magnified conductive strips 19c are represented by resize data.

Figure 10D:
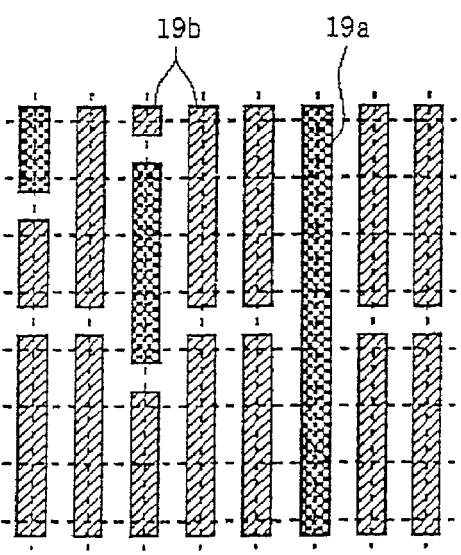

Subsequently, the computer-aided design tool carries out the NOT operation on the redesign data and, thereafter, the OR operation the between the composite design data and the inverted redesign data. The image of the magnified conductive strips 19c is subtracted from the image of the conductive strips/possible conductive strips 19a/19b. Then, the computer-aided design tool determines the pattern data representative of the pattern of the fourth metallization layer 19 (see FIG. 6), and produces an image representative of the result of the subtraction, i.e., the pattern data as shown in figure 10D. Thus, the pattern in the fourth metallization layer 19 is obtained.

Figure 11A:
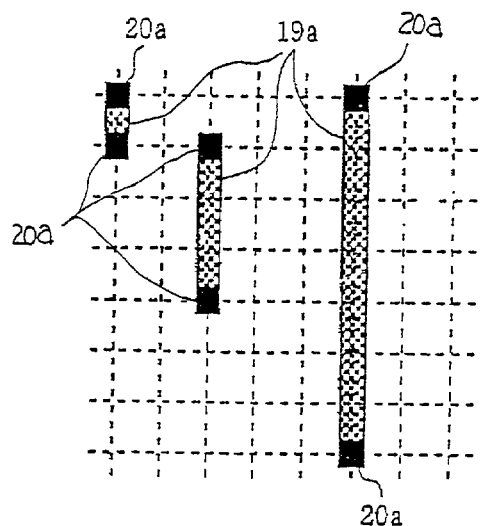
FIGS. 11A to 11F are schematic plane views showing a design work on the contact holes to be filled with the conductive plugs.
Figure 11B:
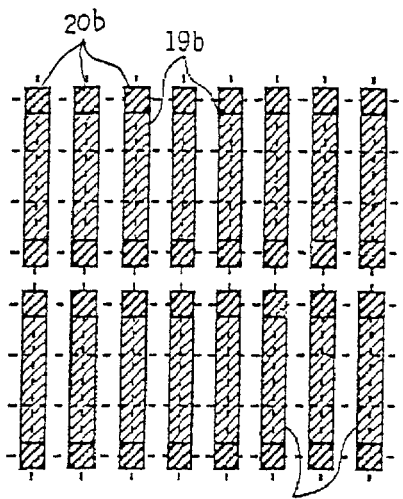

The pattern of conductive plugs 20, i.e., the contact holes in the fifth inter-layered insulating layer is designed as follows. The contact holes are labeled with reference 20a same as that designating the conductive plug. The contact holes 20a are to be formed over both ends of each conductive strip 19a, and FIG. 11A shows the image of the contact holes 20a over the conductive strips 19a. The design data for the contact holes 20a represents the image shown in FIG. 11 A. When a designer calls dummy data representative of the array of possible contact holes 20b, the computer-aided design tool produces an image of possible contact holes 20b together with the image of the possible conductive strips 19b as shown in FIG. 11B. The computer-aided design tool firstly produces composite data representative of the overlapped image between the images shown in FIGS. 11A and 11B.

Figure 11C:
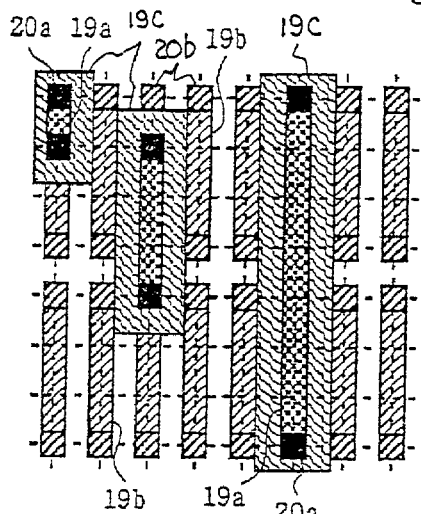
Figure 11D:
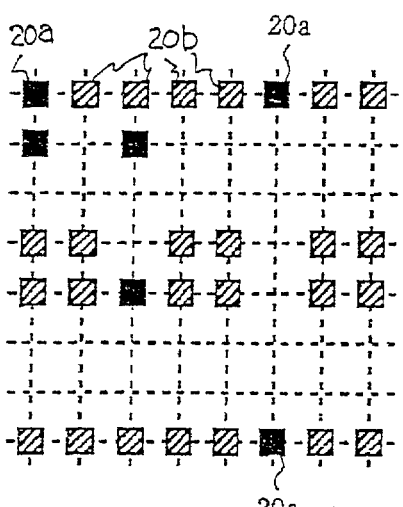
Figure 11E:
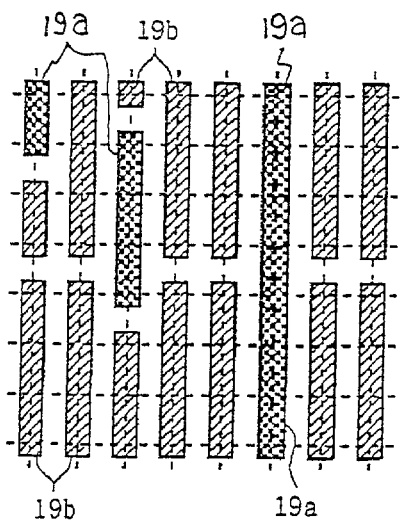
Figure 11F:
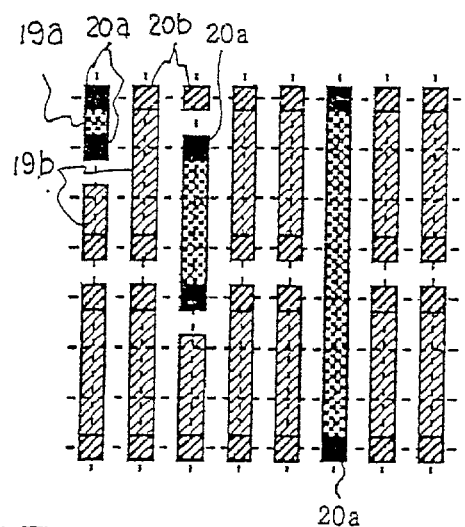

The designer instructs the computer-aided design tool to resize the conductive strips 19a. The computer-aided design tool produces resize data representative of magnified conductive strips 19c. FIG. 11C shows an image of the magnified conductive strips 19c overlapped with the image of the conductive strips 19a, image of the contact holes 20a, image of the possible conductive strips 19b and the image of the possible contact holes 20b. The designer instructs the computer-aided design tool to determine the contact holes 20a and dummy contact holes 20b. The computer-aided design tool carries out the NOT operation on the resize data, the design data representative of the conductive strips 19a and the design data representative of the possible conductive strips 19b, and produces inverted resize data and inverted design data. The computer-aided design tool further carries out the OR operation between the composite data and the inverted resize data/inverted design data. Then, the images of the conductive strips/magnified conductive strips/possible conductive strips 19a/19c/19b are subtracted from the composite image, and the image of the contact holes/ dummy contact holes 20a/20b is produced on the screen as shown in FIG. 11D. FIG. 11E shows the image of the conductive strips/dummy conductive strips 19a/19b in the fourth metallization layer 19. When the designer wants to confirm the relation between the fourth metallization layer 19 and the fifth inter-layered insulating layer 20, the image of the contact holes/dummy contact holes 20a/20b is overlapped with the image of the conductive strips/dummy conductive strips 19a/19b as shown in FIG. 11F.

Upon reception of the order for the redesign, the manufacturer redesigns the integrated circuit device. The manufacturer confirms that one of the dummy conductive strips 12ba is available for the signal path from the output node NO1 of the inverter 26 to the destination. The manufacturer decides the photo-mask for the fourth metallization layer 19 not to be redesigned. However, the manufacturer thinks it impossible to use the photo-mask for the array of contact holes 20a and the photo-mask for the fifth metallization layer 21. The manufacturer changes the design data for the contact holes 20a, and redesigns the pattern of contact holes/dummy contact holes 20a/20b as similar to the pattern shown in FIGS. 11A to 11F.

When the user requests the manufacturer to add another kind of logic gate to insert the signal path, the manufacturer redesigns the integrated circuit device in the similar manner.

If the requirement against the signal delay is serious, the designer reduces the parasitic capacitance coupled between every adjacent two conductive strips 19a, and designs the fourth metallization layer 19 and the contact holes in the fifth inter-layered insulating layer 12e as follows. FIGS. 12A to 12D and 13A to 13F illustrate the design work on the fourth metallization layer 19 and the contact holes formed in the fifth inter-layered insulating layer 12e achieved through the execution of another computer program.

The design data and the dummy data are loaded to the computer-aided design tool. The design data is representative of the conductive strips 19a in the fourth metallization layer, and the computer-aided design tool produces an image of the conductive strips 19a as shown in FIG. 12A. On the other hand, the dummy data is representative of the array of possible conductive strips 19b, and the computer-aided design tool produces an image of possible conductive strips 19b as shown in FIG. 12B.

The computer-aided design tool firstly produces composite data representative of the conductive strips 19a overlapped with the possible conductive strips 19b. Subsequently, the computer-aided design tool magnifies the design data. In order to prevent the conductive strips 19a from a large amount of parasitic capacitance, the computer-aided design tool expands each of the conductive strips 19a by the length equal to four pitches in both of the lateral and longitudinal directions, and produces magnified data. When the computer-aided design tool is requested to produce an image on the basis of the magnified data, the computer-aided design tool produces an image of the conductive strips possible conductive strips 19a/19b overlapped with the magnified conductive strips 19c as shown in FIG. 12C.

Subsequently, the computer-aided design tool carries out the NOT operation on the magnified data and the OR operation between the inverted magnified data and the composite data. The computer-aided design tool subtracts the image of the magnified conductive strips 19c from the image of the conductive strips possible conductive strips 19a/19b, and produces an image of the fourth metallization layer 19 as shown in FIG. 12D.

Figure 13A:
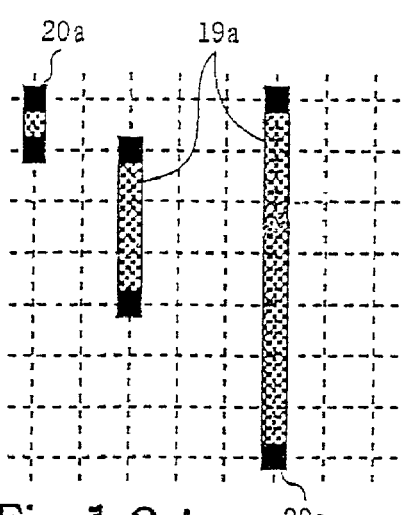
FIGS. 13A to 13F are schematic plane views showing another design work on the contact holes in a fifth inter-layered insulating layer.
Figure 13B:
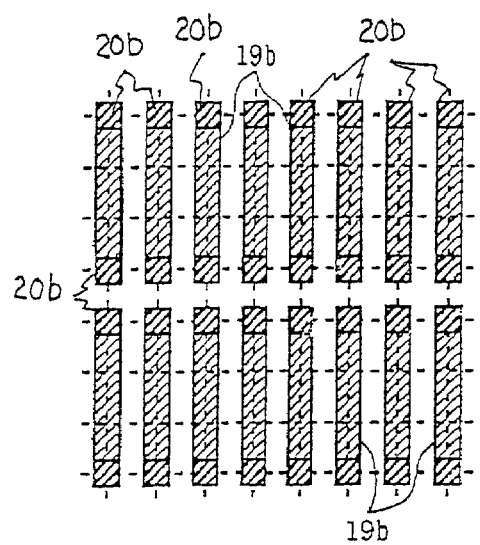

The computer-aided design tool carries out the following data processing for the contact holes 20a on the basis of the pattern in the fourth metallization layer 19 shown in FIG. 12A. The contact holes 20a are to be formed over both ends of each conductive strip 19a, and FIG. 13A shows the image of the contact holes 20a over the conductive strips 19a. The design data for the contact holes 20a represents the image shown in FIG. 13A. When a designer calls dummy data representative of the array of possible contact holes 20b, the computer-aided design tool produces an image of possible contact holes 20b together with the image of the possible conductive strips 19b as shown in FIG. 13B. The computer-aided design tool firstly produces composite data representative of the overlapped image between the images shown in FIGS. 13A and 13B.

Figure 13C:
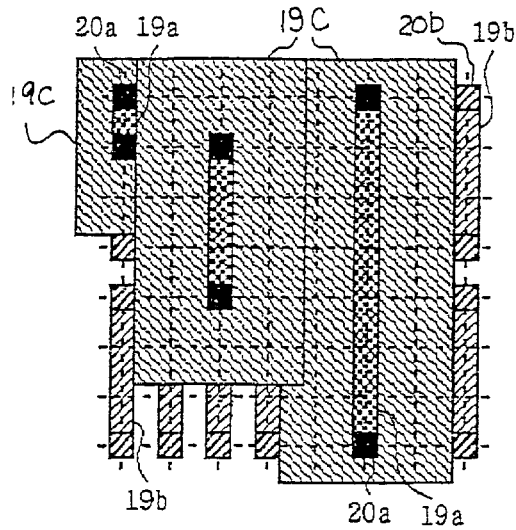

The designer instructs the computer-aided design tool to resize the conductive strips 19a. The computer-aided design tool produces resize data representative of magnified conductive strips 19c. As described hereinbefore in conjunction with the design work on the fourth metallization layer 19, the computer-aided design tool expands each of the conductive strips 19a by the length equal to the four pitched in both lateral and longitudinal directions. FIG. 13C shows an image of the magnified conductive strips 19c overlapped with the image of the conductive strips 19a, image of the contact holes 20a, image of the possible conductive strips 19b and the image of the possible contact holes 20b.

Figure 13D:
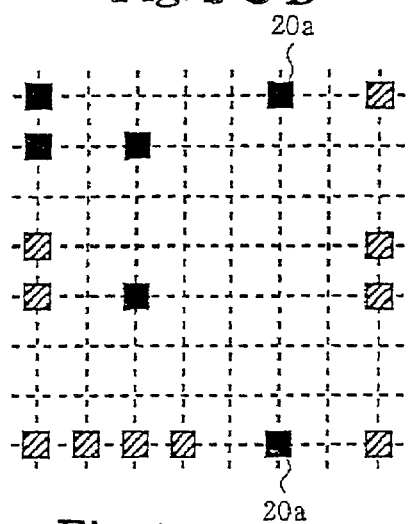

The designer instructs the computer-aided design tool to determine the layout of contact holes/dummy contact holes 20a/20b. The computer-aided design tool carries out the NOT operation on the resize data, the design data representative of the conductive strips 19a and the dummy data representative of the possible conductive strips 19b, and produces inverted resize data and inverted design data. The computer-aided design tool further carries out the OR operation between the composite data and the inverted resize data/inverted design data. Then, the images of the conductive strips/magnified conductive strips/possible conductive strips 19b are subtracted from the composite image, and the image of the contact holes/dummy contact holes 20a/20b is produced on the screen as shown in FIG. 13D. FIG. 12E shows the image of the conductive strips/dummy conductive strips 19a/19b in the fourth metallization layer 19. When the designer wants to confirm the relation between the fourth metallization layer 19 and the fifth inter-layered insulating layer 20, the image of the contact holes/dummy contact holes 20a/20b is overlapped with the image of the conductive strips/dummy conductive strips 19a/19b as shown in FIG. 13F. Thus, the ASIC according to the present invention enhances the degree of design, and the designer can optimize the signal paths with the assistance of the computer-aided design tool.

Figure 13E:
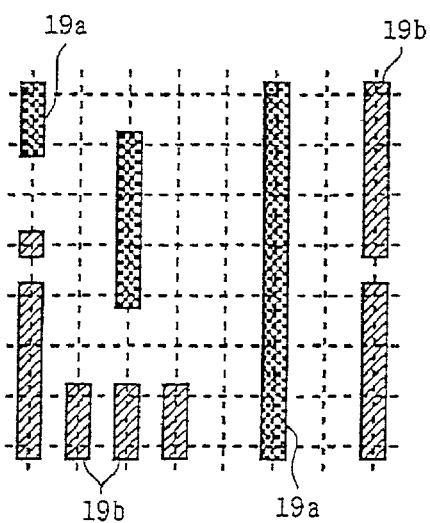
Figure 13F:
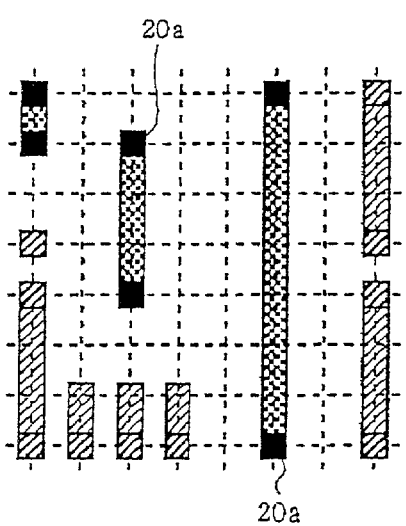
Figure 16:
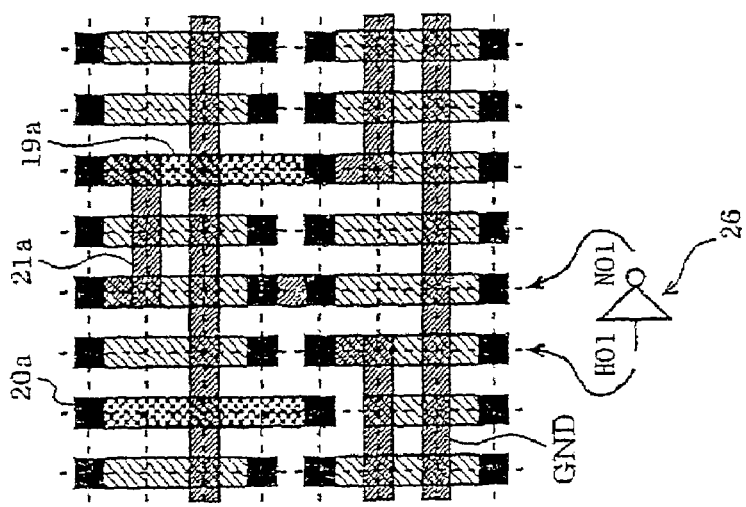
FIG. 16 is a schematic plane view showing patterns determined in a redesign work.

In the redesign work, the designer may notice that the pattern of the fourth metallization layer 19 shown in FIG. 13E does not have a dummy conductive strip available for the interconnection. In this situation, the designer is to determine which is important between the degree of freedom and the signal propagation characteristics.

FIGS. 14 to 18 illustrate another example of the redesign work on the ASIC according to the present invention. In the ASICs described hereinbefore, when the manufacturer redesigns the integrated circuit device, the manufacturer changes the pattern of contact holes 20a as well as the pattern of the conductive strips 21. In this instance, the manufacturer changes only the pattern of the conductive strips 21.

Figure 15:
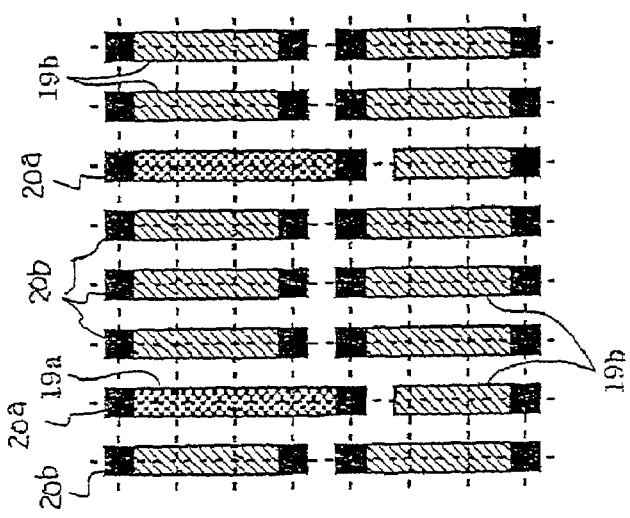
FIG. 15 is a schematic plane view showing a pattern of conductive strips and a pattern of contact holes to be incorporated in the ASIC.
Figure 14:
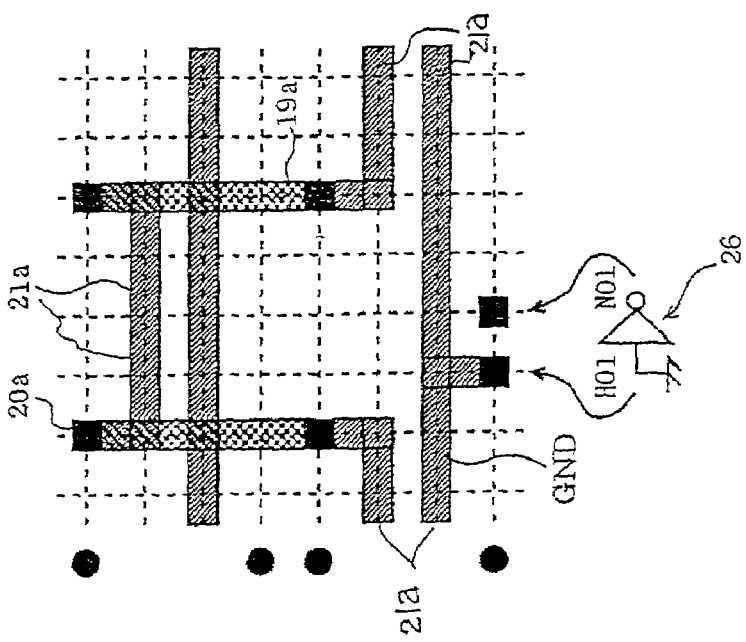
FIG. 14 is a schematic plane view showing signal paths to be incorporated in an ASIC according to the present invention.
Figure 17:
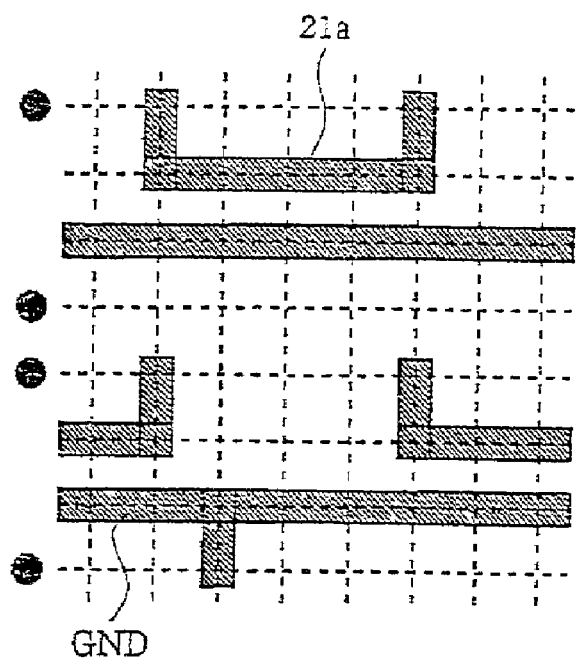
FIG. 17 is a schematic plane view showing the pattern in the fifth metallization layer before the redesign work.

In detail, the manufacturer previously assigns certain lateral tracks to the contact holes 20a or the conductive strips 19. In other words, the manufacturer does not allow any conductive strip 21 to occupy the lateral tracks, and the contact holes 20a and the dummy contact holes 20b are to be formed only in the lateral tracks. The manufacturer gives the instruction for the assignment to the computer-aided design tool before the design work on an integrated circuit device. The manufacturer is assumed to assign the lateral tracks labeled with black circuits (see FIG. 14). The manufacturer designs the fourth and fifth metallization layers 19/21 and the contact holes 20a, which satisfy the conditions of the signal paths. The conductive strips 19a, dummy conductive strips 19b, contact holes 20a and the dummy contact holes 20b are arranged in the fourth metallization layer 19 and the fifth inter-layered insulating layer 20 as shown in FIG. 15, and the conductive strips 21a are arranged in the fifth metallization layer 19 as shown in FIG. 17. Although the conductive strips 20a cross the lateral tracks labeled with the black circles, the contact holes 20a and the dummy contact holes 20b occupy the lateral tracks labeled with the black circles, and any conductive strip 21a does not extend. The conductive strips 21a are allowed to extend along other lateral tracks without using the fourth metallization layer 19. An inverter 26 stands idle.

Figure 18:
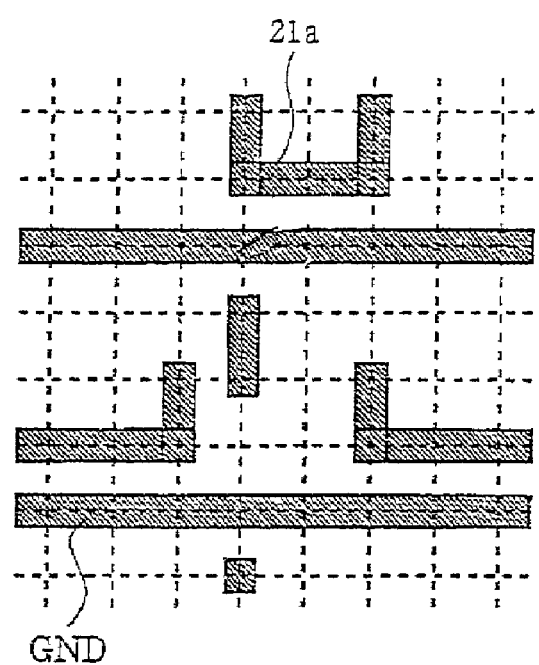
FIG. 18 is a schematic plane view showing the pattern in the fifth metallization layer after the redesign work.

The manufacturer is assumed to redesign the integrated circuit device. The inverter 26 is to be inserted into the signal path (see FIG. 16). Although the fifth metallization layer 21 is redesigned as shown in FIG. 18, the manufacturer reuses the photo-mask for the fourth metallization layer 19 and the photo-mask for the contact holes 20a/20b without any change. The pattern of the fifth metallization layer 21 is further modified due to the ground line GND. In other words, the patterns shown in FIG. 15 are reused in the new integrated circuit device. Thus, although the previous assignment of the certain lateral tracks lowers the degree of design freedom, the photo-mask to be redesigned is only one. Thus, the previous assignment takes part of the redesign work off.

As will be appreciated from the foregoing description, the ASIC according to the present invention has a multi-layered metallization structure broken down into the two parts, i.e., the lower common layer shared between different integrated circuit devices and the multi-layered customized layer unique to an integrated circuit device. The customized layer has at least two metallization layers so that the designer routes the signal paths without any part not participating the signal propagation and frequently changing the signal path between the at least two metallization layers. This results in the reduction in contact resistance and parasitic capacitance. The signal paths propagate signals at high-speed.

The signal paths for the logic design are usually customized in the customized layer. On the other hand, the signal paths for clock signals and test signals are usually built in the common layer. The signal paths for the clock signal and test signals are dependent on the logic cells such as flip flops forming parts of the relating clocked/test circuits, and it is not easy to route the signal paths before locating the logic cells. However, when the location for the relating logic cells is determined, the manufacturer easily routes the signal paths for the clock signals and test signals, and the built-in signal paths are preferable from the viewpoint of high-performance stable electric circuits. Chain signal paths for a scan-path circuit are usually elongated over large-scale macro cells, and the test signals are liable to be deformed in the propagation along the long signal paths. However, those signal paths are optimized in the common layer. The manufacturer can route the signal paths as short as possible, because the signal paths to be customized are to be routed in the customized layer. When the signal paths are designed for the clock signals, the manufacturer locates the clock distribution circuit at an optimum position regardless of the logic cells and large-scale macro cells. This results in that the clock skew is reduced as little as possible. Thus, the clock skew is determined before the customization to an integrated circuit device, and large margin for the clock timing is not required for the electric circuit to be designed in the customization. The signal paths for the user's circuit are less influenced by the clock signals. The prior art ASICs have a uniform power distribution network, because the manufacturer designs the power distribution network before reception of user's order. However, the power distribution lines such as the ground lines are routed in the customized layer in the ASICs according to the present invention. This means that the manufacturer can design the power distribution lines together with the signal paths for the user's circuit. The manufacturer can concentrate a large amount of power voltage to circuits with large current driving capability. Thus, the ASICs according to the present invention is conducive to high-performance stable circuits. The prior art ASICs were designed under the minimum design rules such as 0.25 micron or 0.35 micron. The design rule is getting severe and severe. The ASICs are presently designed under the rule such as 0.18 micron or 0.13 micron. In this situation, the power distribution tends to consume wiring resources more than those consumed in the prior art ASICs. Even though, the ASICs according to the present invention can offer the wiring resources to be required for the user's circuits without loss. Although the customized layer requires two metallization layers and an array of conductive plugs therebetween, only one metallization layer and an array of conductive plug may form Group "B".

Moreover, the customized layer includes reusable pattern or patterns and changeable pattern. Even though the user requests the manufacturer to change a part of the circuit configuration, the manufacturer redesigns only the changeable pattern, and reuses the reusable pattern or patterns. The reusable pattern or patterns take a part of redesign work off, and the manufacturer completes the redesign work for a new design model within a short-turn-around time. Thus, the reusable pattern or patterns is conducive to reduction in production cost for the new design model.

The reusable pattern or patterns have dummy sub-pattern or sub-patterns. The dummy sub-pattern or sub-patterns are spread over the entire surface of the customized layer, and make the fabrication process stable.

Although one particular embodiment of the present invention has been shown and described, it will be apparent to those skilled in the art that various changes and modifications may be made without departing from the spirit and scope of the present invention.

Group C may have two metallization layers. Another sort of ASICs may have more than 5 metallization layers. A sort of ASICs may have a multi-layered structure of metallization which contains eight metallization layers. In this instance, Groups "A", "B" and "C" may have three metallization layers, 4 metallization layers and a single metallization layer, respectively. If ASICs in yet another sort may have twelve metallization layers, Groups "A", "B" and "C" may have four metallization layers, six metallization layers and 2 metallization layers, respectively.

What is claimed is:

1. A method for customizing an intermediate structure of a semi-custom-made integrated circuit device having at least two metallization layers serving as a customized layer unique to said semi-custom-made integrated circuit device and including lower conductive strips extending in certain directions parallel to one another and upper conductive strips extending in directions perpendicular to said certain directions and an inter-layered insulating layer inserted between said lower conductive strips and said upper conductive strips and a common layer formed under said two metallization layers and common to plural sorts of semi-custom-made integrated circuit devices, comprising the steps of:

a) preparing a first design data representative of a first pattern of said lower conductive strips, a first dummy data representative of a first dummy pattern of possible conductive strips equal in length and two-dimensionally arranged at regular pitches, a second design data representative of a second pattern of said upper conductive layers, a third design data representative of a third pattern of contact holes to be formed in said inter-layered insulating layer and said lower conductive strips and a second dummy data representative of a second dummy pattern of possible contact holes to be formed in said inter-layered insulating layer and said possible conductive strips;

b) magnifying said first design data so as to produce a magnified data representative of a resized pattern of extensions occupying closed areas around said lower conductive strips;

c) deleting the possible conductive strips perfectly and partially overlapped with said lower conductive strips and said extensions from said first dummy pattern so as to determine a first pattern for one of said at least two metallization layers;

d) determining a second pattern of said contact holes on the basis of said third design data and said second dummy data; and e) determining a third pattern for the other of said at least two metallization layers.

2. The method as set forth in claim 1, in which said first pattern includes said lower conductive strips and dummy conductive strips disconnected from said upper conductive strips.

3. The method as set forth in claim 1, in which said second pattern includes said contact holes filled with conductive plugs selectively connected between said lower conductive strips and said upper conductive strips and dummy contact holes filled with dummy conductive plugs disconnected from said upper conductive strips.

4. The method for customizing the intermediate structure as set forth in claim 1, in which said common layer is a multi-layered metallization structure formed as a ready-made layer.

5. A method for redesigning a semi-custom-made integrated circuit device including a function layer formed with plural function blocks, a common layer formed on said function layer and having at least one conductive pattern connected to said function blocks and common to plural sorts of semi-custom-made integrated circuit devices and a customized layer unique to said semi-custom-made integrated circuit and having a first pattern of conductive strips, a second pattern of conductive strips perpendicular to said conductive strips of said first pattern and an inter-layered insulating layer inserted between said first pattern and said second pattern and formed with a third pattern of conductive plugs selectively connected between said first conductive strips and said second conductive strips, comprising the steps of:

a) reviewing said first pattern to see what conductive strips are to be connected to the conductive strips of said second pattern without changing said first pattern;

b) checking photo-masks for said second and third patterns to see how many photo-masks are to be newly designed; and c) designing at least one of said photo-masks for a new semi-custom-made integrated circuit device.

6. The method as set forth in claim 5, in which said conductive strips of said first pattern are selectively used as parts of signal paths connected to said conductive strips of said second pattern and dummy strips disconnected from said conductive strips of said second pattern, and said conductive plugs of said third pattern are selectively used as vertical connections of said signal paths and dummy conductive plugs disconnected from said conductive strips of said second pattern.

7. The method as set forth in claim 6, in which plural tracks are defined on said inter-layered insulating layer in directions perpendicular to said conductive strips of said first pattern, and said plural tracks are arbitrarily assignable to said conductive strips of said second pattern.

8. The method as set forth in claim 7, in which both of said photo-masks for said second pattern and said third pattern are determined to be newly designed in said step b).

9. The method as set forth in claim 6, in which plural tracks are defined on said inter-layered insulating layer in directions perpendicular to said conductive strips of said first pattern, and selected ones of said plural tracks are assigned to rows of contact holes selectively filled with said conductive plugs and said dummy conductive plugs and parts of said conductive strips of said first pattern so that said conductive strips of said second pattern extend on selected ones of the remaining tracks.

10. The method for redesigning the semi-custom-made integrated circuit device as set forth in claim 5, in which said conductive pattern is a multi-layered conductive structure formed as a ready-made layer.

* * * * *